(12) United States Patent
Masuda et al.

(10) Patent No.: US 7,990,751 B2
(45) Date of Patent: Aug. 2, 2011

(54) DRIVE METHOD OF NANOGAP SWITCHING ELEMENT AND STORAGE APPARATUS EQUIPPED WITH NANOGAP SWITCHING ELEMENT

(75) Inventors: Yuichiro Masuda, Tsukuba (JP); Shigeo Furuta, Tsukuba (JP); Tsuyoshi Takahashi, Tsukuba (JP); Tetsuo Shimizu, Tsukuba (JP); Yasuhisa Naitoh, Tsukuba (JP); Masayo Horikawa, Tsukuba (JP)

(73) Assignees: Funai Electric Advanced Applied Technology Research Institute Inc., Tsukuba-shi (JP); National Institute of Advanced Industrial Science and Technology, Tokyo (JP); Funai Electric Co., Ltd., Daito-shi (JP)

( * ) Notice: Subject to any disclaimer, the term of this patent is extended or adjusted under 35 U.S.C. 154(b) by 417 days.

(21) Appl. No.: 12/338,313

(22) Filed: Dec. 18, 2008

(65) Prior Publication Data

US 2009/0161407 A1  Jun. 25, 2009

(30) Foreign Application Priority Data

Dec. 20, 2007 (JP) ................................. 2007-328393

(51) Int. Cl.
*G11C 11/00* (2006.01)
*G11C 13/00* (2006.01)
*G11C 7/00* (2006.01)
*G11C 7/22* (2006.01)

(52) U.S. Cl. ............ 365/148; 365/151; 365/189.14; 365/189.15; 365/189.16; 365/189.09; 365/189.07; 977/708; 977/723; 977/940; 977/943

(58) Field of Classification Search .................. 365/148, 365/151, 189.14, 189.15, 189.16, 189.07, 365/189.09, 225.7, 60, 96; 977/708, 723, 977/940, 943
See application file for complete search history.

(56) References Cited

U.S. PATENT DOCUMENTS

2008/0232153 A1* 9/2008 Naitoh et al. ................. 365/148
(Continued)

FOREIGN PATENT DOCUMENTS

JP   2000-200891 A    7/2000
(Continued)

OTHER PUBLICATIONS

Ruttkowski, E. et al., "CMOS based arrays of nanogap devices for molecular electronics", 2005 5th IEEE Conference on Nanotechnology, Nagoya, Japan, Jul. 11-15, 2005, pp. 592-595, XP010831522.

(Continued)

*Primary Examiner* — J. H. Hur
(74) *Attorney, Agent, or Firm* — Crowell & Moring LLP

(57) ABSTRACT

A nanogap switching element is equipped with an inter-electrode gap portion including a gap of a nanometer order between a first electrode and a second electrode. A switching phenomenon is caused in the inter-electrode gap portion by applying a voltage between the first and second electrodes. The nanogap switching element is shifted from its low resistance state to its high resistance state by receiving a voltage pulse application of a first voltage value, and shifted from its high resistance state to its low resistance state by receiving a voltage pulse application of a second voltage value lower than the first voltage value. When the nanogap switching element is shifted from the high resistance state to the low resistance state, a voltage pulse of an intermediate voltage value between the first and second voltage values is applied thereto before the voltage pulse application of the second voltage value thereto.

12 Claims, 6 Drawing Sheets

U.S. PATENT DOCUMENTS

2008/0315184 A1* 12/2008 Furuta et al. .................... 257/30
2009/0039330 A1* 2/2009 Naitoh et al. .................... 257/2
2009/0251199 A1 10/2009 Naitoh et al.

FOREIGN PATENT DOCUMENTS

| JP | 2004-310971 A | 11/2004 |
| JP | 2005-79335 A | 3/2005 |
| JP | 2006-54046 A | 2/2006 |
| WO | WO 2006/102292 A2 | 9/2006 |
| WO | WO 2007/037210 A1 | 4/2007 |

OTHER PUBLICATIONS

The Extended European Search Report dated Mar. 20, 2009 (Five (5) pages).
Naitoh, Yasuhisa et al., "Resistance switch employing a simple metal nanogap junction", Nanotechnology, Nov. 28, 2006, vol. 17, No. 22, pp. 5669-5674, IOP Publishing Ltd., UK. XP020104309.
European Office Action dated Sep. 10, 2010 (Five (5) pages).

* cited by examiner

DRIVE METHOD OF NANOGAP SWITCHING ELEMENT AND STORAGE APPARATUS EQUIPPED WITH NANOGAP SWITCHING ELEMENT

BACKGROUND OF THE INVENTION

1. Field of the Invention

The present invention relates to a drive method of a nanogap switching element and a storage apparatus equipped with a nanogap switching element.

2. Description of Related Art

Further miniaturization of electric elements is now desired as devices have been miniaturized and densified. As an example of the miniaturization, a switching element capable of carrying out a switching operation by the application of a voltage between two electrodes separated by a minute gap (nanogap) is known.

To put it concretely, for example, a switching element has been developed that is made of a stable material of silicon oxide and gold and is manufactured by a simple manufacturing method called as shadow evaporation and further can stably repeat switching operations (see, for example, Japanese Patent Application Laid-Open Publication No. 2005-79335).

Such a switching element having a nanogap (hereinafter referred to as a "nanogap switching element") is configured to receive an application of a voltage pulse having a predetermined voltage value in order to carry out writing or deletion, and to shift itself from its high resistance state (off state) to its low resistance state (on state) and vice versa.

However, the switching element has a problem of a low probability of being shifted to a desired resistance state (especially to the low resistance state) even if a voltage pulse is applied thereto, especially at the time of being shifted from the high resistance state to the low resistance state. A method of elongating the pulse width (that is, the application time of the voltage pulse applied once) or the like was accordingly examined in order to improve the probability of shifting the switching element from the high resistance state to the low resistance state. However, the method of elongating the pulse width has a problem of needing a long time for the elongation of the application time of the voltage pulse applied once. Moreover, the method has also a problem in which the probability of shifting the switching element from the high resistance state to the low resistance state is insufficient yet even if the pulse width is elongated.

For example, the following methods were proposed accordingly: a method of realizing the reading and writing of multiple-value storage against a memory cell array including a plurality of memory cells, each having a floating gate, (see, for example, Japanese Patent Application Laid-Open Publication No. 2000-200891), a method of writing data into a desired cell without charging and discharging any bit lines to carry out the whole process of data writing without charging and discharging any bit lines with a high voltage in a semiconductor storage apparatus having memory cells to store data by the polarization states of ferro-electric capacitors (see, for example, Japanese Patent Application Laid-Open Publication No. 2004-310971), and a method of improving writing margins without lowering the integration degree of memory cells, each having a magnetic tunnel junction structure, to decrease writing currents without lowering the integration degree in a magnetic random access memory (RAM) device equipped with the memory cells (see, for example, Japanese Patent Application Laid-Open Publication No. 2006-54046).

However, because the memory elements (memory cells) disclosed in Japanese Patent Application Laid-Open Publications No. 2000-200891, No. 2004-310971, and No. 2006-54046, mentioned above, are not the nanogap switching elements, the aforesaid problem of the impossibility of shifting the nanogap switching elements to their low resistance states with a high probability cannot be solved even if the methods described in Japanese Patent Application Laid-Open Publications No. 2000-200891, No. 2004-310971, and No. 2006-54046 are applied to the nanogap switching elements.

SUMMARY OF THE INVENTION

The present invention is directed to provide a drive method of a nanogap switching element capable of shifting the nanogap switching element from its high resistance state to its low resistance state with a high probability and a storage apparatus capable of shifting its nanogap switching elements from their high resistance states to their low resistance states in accordance with the drive method.

According to a first aspect of the present invention, there is provided a drive method of a nanogap switching element, the nanogap switching element including an insulation substrate, first and second electrodes formed on the insulation substrate, and an inter-electrode gap portion formed between the first and second electrodes and including a gap of a nanometer order between them for causing a switching phenomenon of a resistance of the inter-electrode gap portion by applying a predetermined voltage between the first and second electrodes thereto, wherein a voltage pulse of a first voltage value is applied to the nanogap switching element in order to be shifted from a predetermined low resistance state to a predetermined high resistance state and a voltage pulse of a second voltage value lower than the first voltage value is applied to the nanogap switching element in order to be shifted from the high resistance state to the low resistance state, the method comprising the step of: applying a voltage pulse of an intermediate voltage value between the first voltage value and the second voltage value to the nanogap switching element before applying the voltage pulse of the second voltage value thereto at the time of shifting the nanogap switching element from the high resistance state to the low resistance state.

According to a second aspect of the present invention, there is provided a drive method of a nanogap switching element, the nanogap switching element including an insulation substrate, first and second electrodes formed on the insulation substrate, and an inter-electrode gap portion formed between the first and second electrodes to include a gap of a nanometer order between them for causing a switching phenomenon of a resistance of the inter-electrode gap portion by applying a predetermined voltage between the first and second electrodes thereto, wherein a voltage pulse of a first voltage value is applied to the nanogap switching element in order to be shifted from a predetermined low resistance state to a predetermined high resistance state and a voltage pulse of a second voltage value lower than the first voltage value is applied to the nanogap switching element in order to be shifted from the high resistance state to the low resistance state, the method comprising steps executed at the time of shifting the nanogap switching element from the high resistance state to the low resistance state, wherein the steps include: a first application step of applying the voltage pulse of the second voltage value once to the nanogap switching element; a first judgment step of judging whether the nanogap switching element has been shifted from the high resistance state to the low resistance state or not by applying the voltage pulse of the second voltage value thereto; a second application step of applying a voltage pulse of an intermediate voltage value between the first voltage value and the second voltage value once to the nanogap switching element, and then applying the voltage pulse of the second voltage value once to the nanogap switching element after applying the voltage pulse of the intermediate voltage value thereto if the nanogap switching element is judged not to have been shifted from the high resistance state to the low resistance state at the first judgment step; a second judgment step of judging whether the nanogap switching element has been shifted from the high resistance state to the low resistance state or not by applying the voltage pulses of the intermediate voltage value and the second voltage value thereto; a third application step of applying the voltage pulses of the intermediate voltage values to the nanogap switching element by a plurality of times so that the number of applications of the voltage pulses of the intermediate voltage value thereto may be larger than the number of applications at the last time, and then applying the voltage pulse of the second voltage value once to the nanogap switching element after applying the voltage pulses of the intermediate voltage value thereto if the nanogap switching element is judged not to have been shifted from the high resistance state to the low resistance state at the second judgment step; and a step of carrying out the second judgment step and the third application step repeatedly until the nanogap switching element is judged to have been shifted from the high resistance state to the low resistance state at the second judgment step.

According to a third aspect of the present invention, there is provided a drive method of a nanogap switching element, the nanogap switching element including an insulation substrate, first and second electrodes formed on the insulation substrate, and an inter-electrode gap portion formed between the first and second electrodes to include a gap of a nanometer order between them for causing a switching phenomenon of a resistance of the inter-electrode gap portion by applying a predetermined voltage between the first and second electrodes thereto, wherein a voltage pulse of a first voltage value is applied to the nanogap switching element in order to be shifted from a predetermined low resistance state to a predetermined high resistance state and a voltage pulse of a second voltage value lower than the first voltage value is applied to the nanogap switching element in order to be shifted from the high resistance state to the low resistance state, the method comprising steps at the time of shifting the nanogap switching element from the high resistance state to the low resistance state, wherein the steps include: a first application step of applying a voltage pulse of an intermediate voltage value between the first voltage value and the second voltage value to the nanogap switching element once, and then applying the voltage pulse of the second voltage value thereto once after applying the voltage pulse of the intermediate voltage value thereto; a judgment step of judging whether the nanogap switching element has been shifted from the high resistance state to the low resistance state or not by applying the voltage pulses of the intermediate voltage value and the second voltage value thereto; a second application step of applying the voltage pulses of the intermediate voltage values to the nanogap switching element by a plurality of times so that the number of applications of the voltage pulses of the intermediate voltage value thereto may be larger than the number of applications at the last time, and then applying the voltage pulse of the second voltage value once to the nanogap switching element after applying the voltage pulses of the intermediate voltage value thereto if the nanogap switching element is judged not to have been shifted from the high resistance state to the low resistance state at the judgment step; and a step of carrying out the judgment step and the second application step repeatedly until the nanogap switching element is judged to have been shifted from the high resistance state to the low resistance state at the judgment step.

According to a fourth aspect of the present invention, there is provided a storage apparatus comprising a nanogap switching element, the nanogap switching element being shifted from its high resistance state to its low resistance state by the drive method according to the above mentioned drive methods.

According to the present invention, a nanogap switching element includes an insulation substrate, first and second electrodes formed on the insulation substrate, an inter-electrode gap portion formed between the first and second electrodes to include a gap of a nanometer order between them for causing a switching phenomenon of a resistance of the inter-electrode gap by applying a predetermined voltage between the first and second electrodes, and the nanogap switching element receives an application of a voltage pulse of a first voltage value in order to be shifted from its predetermined low resistance state to its predetermined high resistance state and an application of a voltage pulse of a second voltage value lower than the first voltage value in order to be shifted from the high resistance state to the low resistance state. A drive method of the nanogap switching element and a storage apparatus equipped with the nanogap switching element are configured to apply a voltage pulse of an intermediate voltage value between the first voltage value and the second voltage value to the nanogap switching element before the application of the voltage pulse of the second voltage value at the time of shifting the nanogap switching element from the high resistance state to the low resistance state.

Consequently, because a cue to shift the nanogap switching element from its high resistance state to its low resistance state can be given by applying the voltage pulse of the intermediate voltage value to the nanogap switching element, the nanogap switching element can be shifted from the high resistance state to the low resistance state with a higher probability than that of the related art.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein:

FIG. 2 is a sectional view schematically showing the principal part of a nanogap switching element that the storage apparatus of the present invention is equipped with;

FIG. 3 is a block diagram showing the functional configuration of a control section that the storage apparatus of the present invention is equipped with;

DETAILED DESCRIPTION OF THE PREFERRED EMBODIMENTS

In the following, a concrete embodiment of the present invention will be described with reference to the attached drawings. However, the scope of the present invention is not limited to the shown examples.

<Storage Apparatus Equipped with Nanogap Switching Elements>

The configuration of a storage apparatus 1000 will be described first with reference to FIGS. 1-3.

The storage apparatus 1000 is an apparatus equipped with a memory element array including a plurality of memory elements arranged in an array for storing data. In the storage apparatus 1000 of the present invention, the memory elements are nanogap switching elements 10, and the memory element array is a nanogap switching element array 100.

Figure 1:
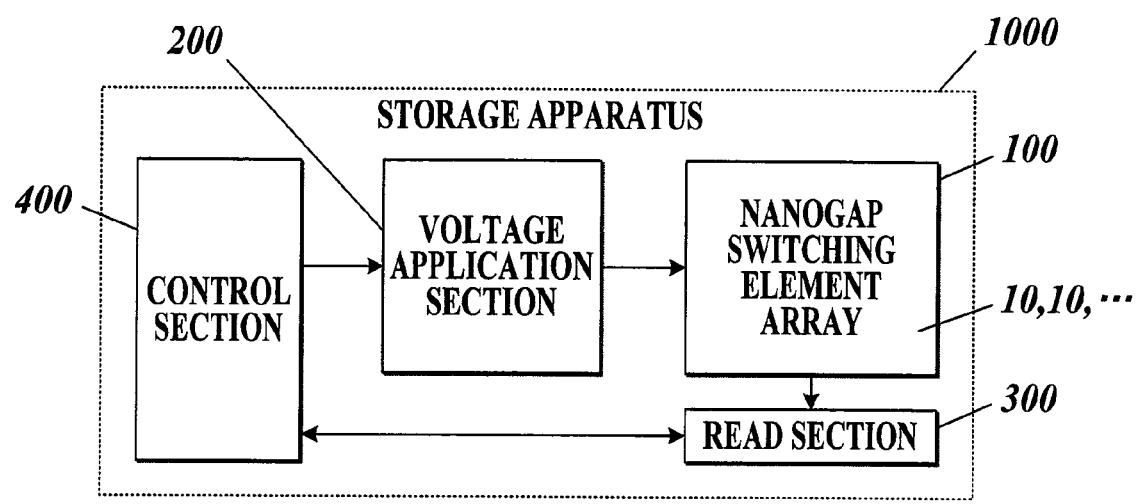
FIG. 1 is a block diagram showing the functional configuration of a storage apparatus of the present invention.

To put it concretely, the storage apparatus 1000 is equipped with, for example, the nanogap switching element array 100, a voltage application section 200, a read section 300, and a control section 400 as shown in FIG. 1.

(Nanogap Switching Element Array)

The nanogap switching element array 100 is a high density memory including, for example, a plurality of nanogap switching elements 10 arranged in an array (for example, a two-dimensional array).

(Nanogap Switching Elements)

The nanogap switching elements 10 are memory elements, each storing data by switching the resistance between nanogap electrodes (the gap in an inter-electrode gap portion 4).

Figure 2:
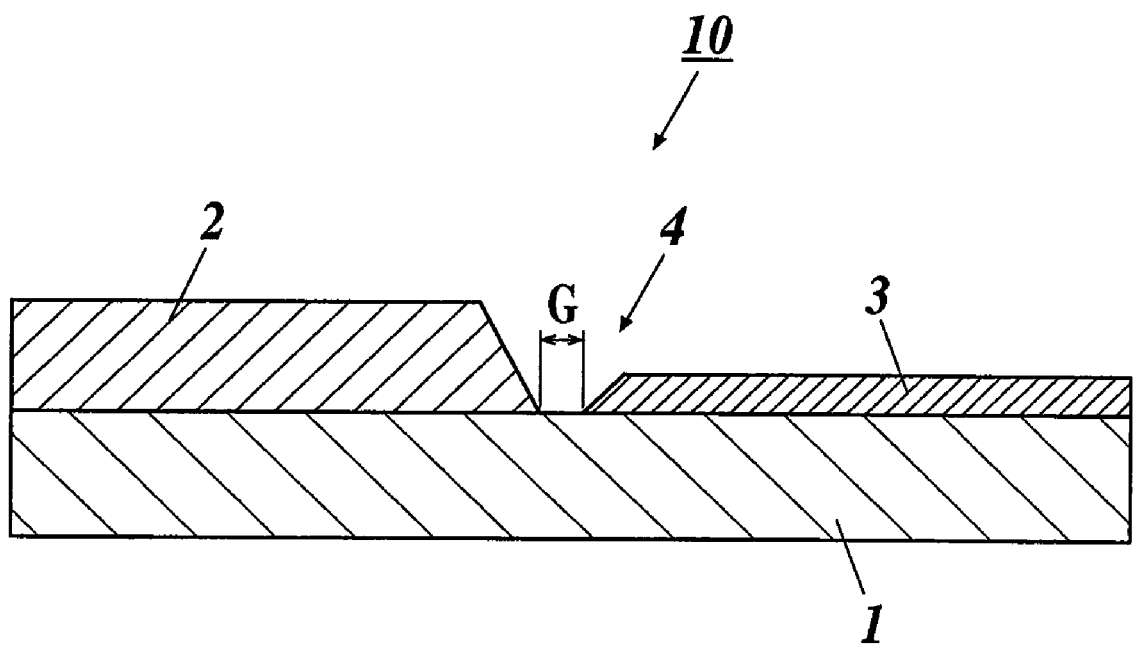

To put it concretely, each of the nanogap switching elements 10 is equipped with, for example, an insulation substrate 1, a first electrode 2 and a second electrode 3, both formed on a surface (top surface) of the insulation substrate 1, and the inter-electrode gap portion 4 formed between the first and second electrodes 2 and 3 as shown in FIG. 2.

The insulation substrate 1 functions as, for example, a support member for separating and supporting the two electrodes (the first and second electrodes 2 and 3) of each of the nanogap switching elements 10.

The structure and quality of material of the insulation substrate 1 are not especially limited. To put it concretely, for example, the shape of the surface of the insulation substrate 1 may be either a flat surface or an uneven surface. Moreover, the insulation substrate 1 may be, for example, a substrate including an oxide film or the like on a surface of a semiconductor substrate made of silicon (Si) or the like, or a substrate having an insulation property itself.

As the quality of material of the insulation substrate 1, for example, glass, an oxide, such as silicon oxide ($SiO_2$), and a nitride, such as silicon nitride (SiN) are preferable, and among them, silicon oxide ($SiO_2$) is suitable for the insulation substrate 1 owing to its large magnitudes of its adhesion property to the first and second electrodes 2 and 3 and the degree of freedom in its manufacturing.

The first electrode 2 is an electrode for performing switching operations of each of the nanogap switching elements 10 with the second electrode 3 made to be a pair.

The shape of the first electrode 2 is not especially limited, but can be suitably arbitrarily changed.

The quality of material of the first electrode 2 is not especially limited, but it is preferable to be, for example, at least one selected from the group of gold, silver, platinum, palladium, nickel, aluminum, cobalt, chromium, rhodium, copper, tungsten, tantalum, carbon, and their alloys. The first electrode 2 may be used in a form of superposing, for example, two or more layers of different metals in order to strengthen its adhesion to the insulation substrate 1 here. To put it concretely, the first electrode 2 may be formed in a laminated (multilayered) structure of, for example, chromium and gold.

The second electrode 3 is an electrode for performing the switching operations of each of the nanogap switching elements 10 with the first electrode 2 made to be the pair.

The shape of the second electrode 3 is not especially limited, but can be suitably arbitrarily changed.

The quality of material of the second electrode 3 is not especially limited, but it is preferable to be, for example, at least one selected from the group of gold, silver, platinum, palladium, nickel, aluminum, cobalt, chromium, rhodium, copper, tungsten, tantalum, carbon, and their alloys. The second electrode 3 may be used in a form of superposing, for example, two or more layers of different metals in order to strengthen its adhesion to the insulation substrate 1 here. To put it concretely, the second electrode 3 may be formed in a laminated (multilayered) structure of, for example, chromium and gold.

The inter-electrode gap portion 4 is formed between the first and second electrodes 2 and 3, and fills the role of realizing the switching phenomenon of each of the nanogap switching elements 10.

To put it concretely, the inter-electrode gap portion 4 includes a gap of a nanometer order, which causes the switching phenomenon of the resistance of each of the inter-electrode gap portion 4 by the application of a predetermined voltage between the first and second electrodes 2 and 3. That is, the distance (interval) G between the first and second electrodes 2 and 3 (between the nanogap electrodes) is set to be the nanometer order.

Incidentally, one or a plurality of closest parts between the first and second electrodes 2 and 3 (the gap of the inter-electrode gap portion 4) may be formed in the region in which the first and second electrodes 2 and 3 are opposed to each other.

Moreover, an island portion (sandbank portion) made of, for example, the constituent materials of the first and second electrodes 2 and 3 may be formed between the first and second electrodes 2 and 3. In this case, it is sufficient that predetermined gaps (the gap of the inter-electrode gap portion 4) are formed between the first electrode 2 and the island portion and between the second electrode 3 and the island portion, and that the first and second electrodes 2 and 3 do not short-circuit with each other.

(Voltage Application Section)

The voltage application section 200 is connected to, for example, the plurality of nanogap switching elements 10 included in the nanogap switching element array 100 and the control section 400. The voltage application section 200 applies a voltage (voltage pulse) between the first and second electrodes 2 and 3 of each of the nanogap switching elements 10 in conformity with a control signal input from the control section 400 to write data into each of the nanogap switching elements 10 or to delete data from each of the nanogap switching elements 10.

To put it concretely, the voltage application section 200 is configured to receive the inputs of, for example, the address information pertaining to the position of one of the nanogap switching elements 10 to which the control section 400 applies a voltage pulse, and the voltage value information pertaining to the voltage value of the voltage pulse to be applied to the nanogap switching element 10. Then the voltage application section 200 is configured to apply the voltage pulse of the voltage value based on the voltage value information to the nanogap switching element 10 appointed by the address information among the plurality of nanogap switching elements 10 included in the nanogap switching element array 100 when these pieces of information are input.

(Read Section)

The read section 300 is connected to, for example, the plurality of nanogap switching elements 10 included in the nanogap switching element array 100, and the control section 400. The read section 300 reads data from the nanogap switching elements 10 in conformity with a control signal input from the control section 400, and outputs the read results to the control section 400.

To put it concretely, the read section 300 is configured to receive the input of the address information pertaining to the position of one of the nanogap switching elements 10 from which data is to be read or the like from the control section 400. Then, the read section 300 is configured to measure the resistance value between the nanogap electrodes (the gap of the inter-electrode gap portion 4) of the nanogap switching element 10 appointed by the address information among the plurality of nanogap switching elements 10 included in the nanogap switching element array 100 to read data from the nanogap switching element 10 when the address information or the like is input thereinto.

(Control Section)

Figure 3:
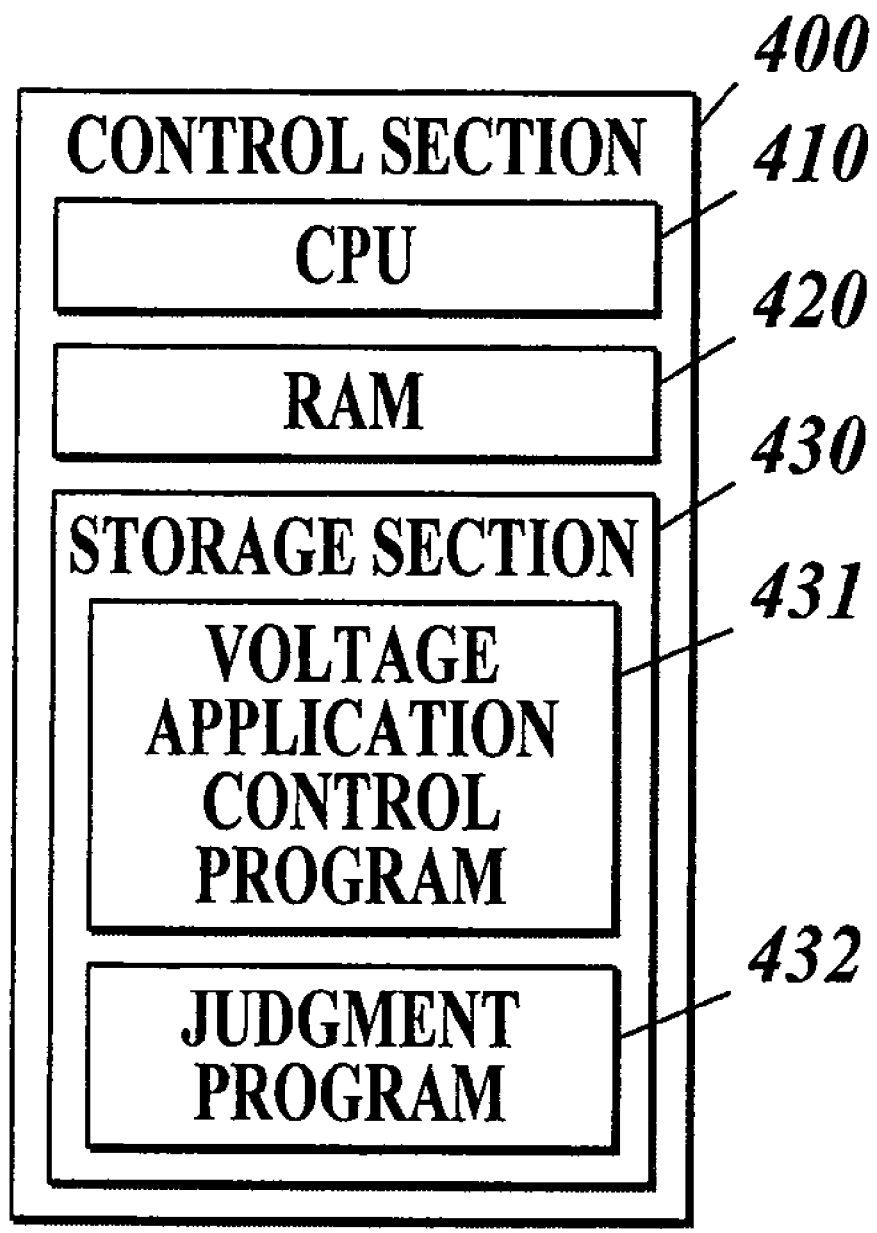

The control section 400 is equipped with, for example, a central processing unit (CPU) 410, a random access memory (RAM) 420, and a storage section 430 as shown in FIG. 3.

The CPU 410 carries out various control operations in accordance with, for example, various processing programs, stored in the storage section 430, for the storage apparatus 1000.

The RAM 420 is equipped with, for example, a program storage region for expanding the processing programs to be executed by the CPU 410, and a data storage region to store input data, the processing results produced at the time of the execution of the processing programs, and the like.

The storage section 430 stores, for example, a system program executable on the storage apparatus 1000, the various processing programs executable on the system program, the data to be used at the time of the execution of the various processing programs, and the data of the processing results of the operation processing of the CPU 410. Incidentally, the programs are stored in the storage section 430 in the form of program codes readable by a computer.

To put it concretely, the storage section 430 stores, for example, a voltage application control program 431 and a judgment program 432 as shown in FIG. 3.

The voltage application control program 431 helps the CPU 410 to realize the function of inputting control signals (such as address information and voltage value information) to the voltage application section 200 to apply voltage pulses of predetermined pulse widths to the nanogap switching elements 10.

As the predetermined pulse widths, the pulse widths from several nanoseconds to several hundred microseconds are preferable here.

To put it concretely, the CPU 410 is configured to input a control signal to the voltage application section 200 to make the voltage application section 200 apply a voltage pulse of a first voltage value to one of the nanogap switching elements 10 at the time of shifting the nanogap switching element 10 from its low resistance state (on state) to its high resistance state (off state), and is configured to input a control signal to the voltage application section 200 to make the voltage application section 200 apply a voltage pulse of a second voltage value to one of the nanogap switching elements 10 at the time of shifting the nanogap switching element 10 from its high resistance state (off state) to its low resistance state (on state).

Furthermore, the CPU 410 is configured to apply a voltage pulse of an intermediate voltage value before applying the voltage pulse of the second voltage value at the time of shifting one of the nanogap switching elements 10 from its high resistance state (off state) to its low resistance state (on state).

The second voltage value is set to be lower than the first voltage value here, and the intermediate voltage value is set to be an intermediate value between the first voltage value and the second voltage value.

Incidentally, the CPU 410 may be configured to shift one of the nanogap switching elements 10 from its high resistance state (off state) to its low resistance state (on state) at the time of writing data into the nanogap switching element 10, and to shift the nanogap switching element 10 from the low resistance state (on state) to the high resistance state (off state) at the time of deleting data from the nanogap switching element 10. Alternatively, the CPU 410 may be configured to shift one of the nanogap switching elements 10 from its low resistance state (on state) to its high resistance state (off state) at the time of writing data into the nanogap switching element 10, and to shift the nanogap switching element 10 from the high resistance state (off state) to the low resistance state (on state) at the time of deleting data from the nanogap switching element 10.

Moreover, the resistance value between the nanogap electrodes (over the gap of the inter-electrode gap portion 4) when each of the nanogap switching elements 10 is in its low resistance state and the resistance value between the nanogap electrodes (over the gap of the inter-electrode gap portion 4) when the nanogap switching element 10 is in its high resistance state are arbitrary as long as the resistance values are within a range within which the CPU 410 can execute the judgment program 432 to distinguish between the low resistance state and the high resistance state by relatively judging the resistance values on the basis of a read result from the read section 300.

To put it more concretely, for example, when the CPU 410 shifts one of the nanogap switching elements 10 from its high resistance state to its low resistance state, the CPU 410 first applies a voltage pulse of the second voltage value to the nanogap switching element 10.

Then, if the CPU 410 judges that the nanogap switching element 10 has not been shifted from the high resistance state to the low resistance state by the application of the voltage pulse of the second voltage value thereto, then the CPU 410 applies a voltage pulse of an intermediate voltage value to the nanogap switching element 10, and after that, applies the voltage pulse of the second voltage value thereto.

Then, if the CPU 410 judges that the nanogap switching element 10 has not been shifted yet from the high resistance state to the low resistance state by the applications of the voltage pulses of the intermediate voltage value and the second voltage value, then the CPU 410 increases the number of applications of the voltage pulses of the intermediate voltage values in comparison with that at the last time to apply the voltage pulses of the intermediate voltage values to the nanogap switching element 10. After that, the CPU 410 applies the voltage pulse of the second voltage value to the nanogap switching element 10.

The second voltage value is set to five volts and the number of applications of the voltage pulses of the second voltage value to the nanogap switching element 10 is set to one. Moreover, the intermediate voltage value is set to an arbitrary value between the first voltage value (for example ten volts) and the second voltage value (five volts), and the number of applications of the voltage pulses of the intermediate voltage value is set to one first and then is set to be increased one by one every judgment of the non-shifting of the addressed nanogap switching element 10 from its high resistance state to its low resistance state. The intermediate voltage values are set to be gradually lowered if the number of applications of the voltage pulses of the intermediate voltage values is plural. That is, if the number of applications of the voltage pulses of the intermediate voltage values is one, then a voltage pulse of, for example, seven volts (the voltage pulse of an intermediate voltage value) is once applied to the nanogap switching element 10, and after that, a voltage pulse of five volts (the voltage pulse of the second voltage value) is once applied to the nanogap switching element 10. Then it is carried out to rejudge whether the nanogap switching element 10 has been shifted from the high resistance state to the low resistance state or not. If the number of applications of the voltage pulses of the intermediate voltage values is two, then a voltage pulse of, for example, eight volts (the voltage pulse of an intermediate voltage value) is once applied to the nanogap switching element 10, and after that, a voltage pulse of six volts (the voltage pulse of another intermediate voltage value) is once applied thereto, following which a voltage pulse of five volts (the voltage pulse of the second voltage value) is once applied thereto. Then it is carried out to rejudge whether the nanogap switching element 10 has been shifted from the high resistance state to the low resistance state or not. If the number of applications of the voltage pulses of the intermediate voltage values is three, then a voltage pulse of, for example, eight volts (the voltage pulse of an intermediate voltage value), a voltage pulse of seven volts (the voltage pulse of another intermediate voltage value), and a voltage pulse of six volts (the voltage pulse of a further voltage value) are sequentially applied to the nanogap switching element 10 severally once, and after that, a voltage pulse of five volts (the voltage pulse of the second voltage value) is once applied thereto. Then it is carried out to rejudge whether the nanogap switching element 10 has been shifted from the high resistance state to the low resistance state or not.

Moreover, when the CPU 410 shifts one of the nanogap switching elements 10 from its low resistance state to its high resistance state, the CPU 410 applies a voltage pulse of the first voltage value.

The first voltage value is set to ten volts, and the number of applications of the voltage pulses of the first voltage value is set to one, here.

The judgment program 432 helps the CPU 410 to realize the function of judging whether each of the nanogap switching elements 10 has been shifted from its high resistance state to its low resistance state or not.

To put it concretely, for example, when the CPU 410 applies a voltage pulse of the second voltage value to one of the nanogap switching elements 10, the CPU 410 inputs a control signal (such as address information) to the read section 300 to make the read section 300 read data from the nanogap switching element 10, and then the CPU 410 judges whether the nanogap switching element 10 has been shifted from its high resistance state to its low resistance state or not.

<Drive Method of Nanogap Switching Elements>

Figure 4:
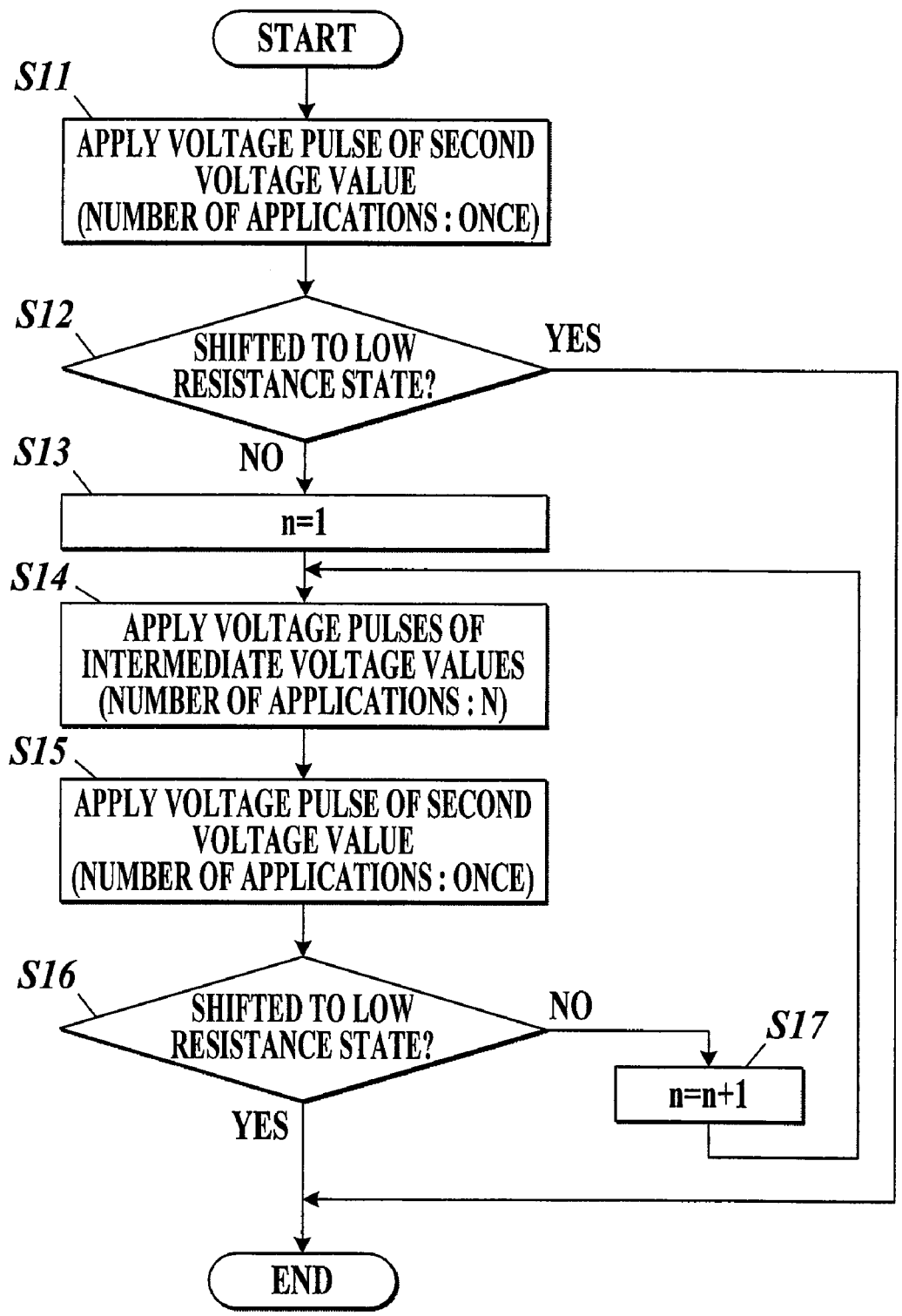
FIG. 4 is a flow chart for illustrating a drive method of the nanogap switching element of the present invention.

The processing of shifting one of the nanogap switching elements 10 from its high resistance state to its low resistance state by the storage apparatus 1000 will be described as a drive method of the nanogap switching elements 10 with reference to the flow chart of FIG. 4.

The CPU 410 first executes the voltage application control program 431 to apply a voltage pulse of the second voltage value to the nanogap switching element 10 once (Step S11).

The CPU 410 next executes the judgment program 432 to judge whether the nanogap switching element 10 has been shifted from its high resistance state to its low resistance state or not (Step S12).

If the CPU 410 judges that the nanogap switching element 10 has been shifted from the high resistance state to the low resistance state at Step S12 (Step S12: Yes), then the CPU 410 ends the present processing.

On the other hand, if the CPU 410 judges that the nanogap switching element 10 has not been shifted from the high resistance state to the low resistance state at Step S12 (Step S12: No), then the CPU 410 sets "1" in the "n" storage region in the RAM 420 (Step S13).

The CPU 410 next executes the voltage application control program 431 to apply a voltage pulse of an intermediate voltage value to the nanogap switching element 10 n times (Step S14), and applies a voltage pulse of the second voltage value to the nanogap switching element 10 once (Step S15).

The CPU 410 next executes the judgment program 432 to judge whether the nanogap switching element 10 has been shifted from the high resistance state to the low resistance state or not (Step S16).

If the CPU 410 judges that the nanogap switching element 10 has not been shifted from the high resistance state to the low resistance state at Step S16 (Step S16: No), then the CPU 410 sets a number "n+1" into the "n" storage region in the RAM 420 (Step S17), and performs the processing on and after Step S14 repeatedly.

On the other hand, if the CPU 410 judges that the nanogap switching element 10 has been shifted from the high resistance state to the low resistance state at Step S16 (Step S16: Yes), then the CPU 410 ends the present processing.

Step S11 corresponds to the first application step in claim 2 or claim 5, and Step S12 corresponds to the judgment step in claim 2 or the first judgment step in claim 5 here. If "1" is set in the "n" storage region in the RAM 420, then Step S14 and Step S15 correspond to the second application step in claim 2 or claim 5, and Step S16 corresponds to the second judgment step in claim 3 or claim 5. If a "value of 2 or more" is set in the "n" storage region in the RAM 420, then Step S14 and Step S15 correspond to the third application step in claim 3 or claim 5, and Step S16 corresponds to the second judgment step in claim 3 or claim 5.

EXAMPLE

In the following, the present invention will be more minutely described by using a concrete example, but the present invention is not limited to the concrete example.

Example 1

The voltage pulse of an intermediate voltage value and a voltage pulse of the second voltage value were repeatedly applied to one of the nanogap switching elements 10 included in the storage apparatus 1000 of the present invention, and the resistance value between the nanogap electrodes (over the gap of the inter-electrode gap portion 4) of the nanogap switching element 10 was measured before and after the applications of the voltage pulses. The intermediate voltage value was set to seven volts, and the second voltage value was set to five volts. The voltage pulse of the intermediate voltage value and the voltage pulse of the second voltage value were severally applied to the nanogap switching element 10 once, and the pulse width of each of the voltage pulses of the intermediate voltage value and the second voltage value (the application time of each of the voltage pulses applied once) was set to ten nanoseconds (100 MHz).

That is, the nanogap switching element 10 was first shifted from its low resistance state to its high resistance state, and then the resistance value between the nanogap electrodes of the nanogap switching element 10 was measured. Next, the voltage pulse of seven volts (the voltage pulse of the intermediate voltage value) was once applied to the nanogap switching element 10 for its pulse width of ten nanoseconds, following which the voltage pulse of five volts (the voltage value of the second voltage value) was once applied thereto for its pulse width of ten nanoseconds. Next, the resistance value of the nanogap electrodes of the nanogap switching element 10 was measured. Such a series of processing was thus carried out repeatedly.

Figure 5A:
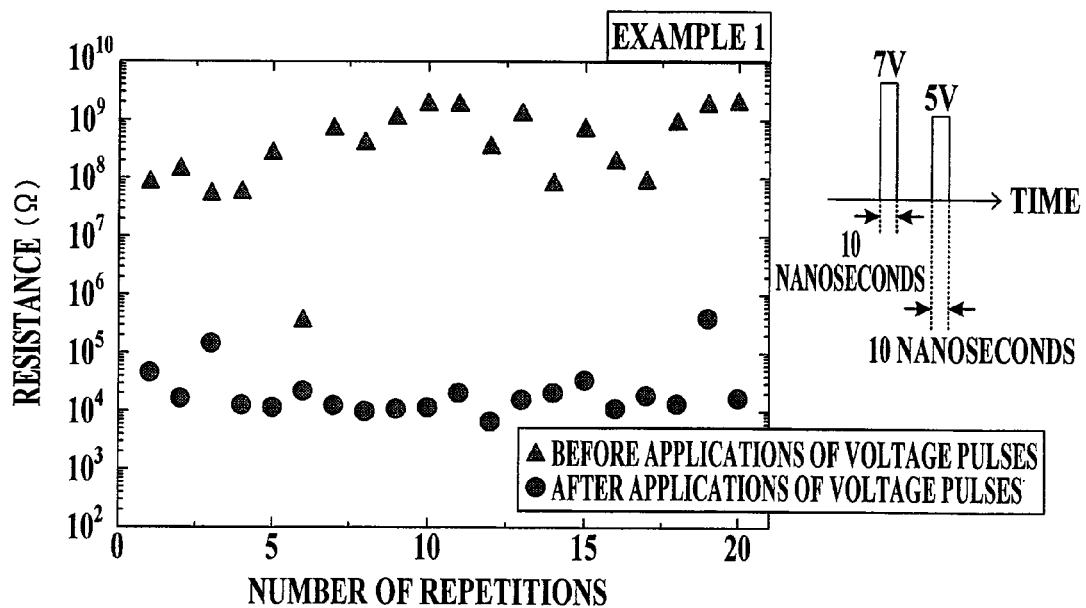
FIG. 5A is a diagram showing the results of resistance value changes at the time of carrying out the applications of voltage pulses repeatedly in Example 1.

The results are shown in FIG. 5A.

The voltage pulse of the second voltage value was repeatedly applied to one of the nanogap switching elements 10 included in the storage apparatus 1000 of the present invention by the method of elongating the pulse width of the voltage pulse (in accordance with the related art method) for comparison as Comparative Example 1, and the resistance value between the nanogap electrodes (over the gap of the inter-electrode gap portion 4) of the nanogap switching element 10 was measured before and after the applications of the voltage pulse. The second voltage value was set to five volts, and the voltage pulse of the second voltage value was once applied to the nanogap switching element 10. The pulse width of the voltage pulse of the second voltage value (the application time of the voltage pulse applied once) was set to 500 nanoseconds (2 MHz).

That is, the nanogap switching element 10 was first shifted from its low resistance state to its high resistance state, and then the resistance value between the nanogap electrodes of the nanogap switching element 10 was measured. Next, the voltage pulse of five volts (the voltage pulse of the second voltage value) was once applied to the nanogap switching element 10 for its pulse width of 500 nanoseconds, and the resistance value of the nanogap electrodes of the nanogap switching element 10 was next measured. Such a series of processing was thus carried out repeatedly.

Figure 5B:
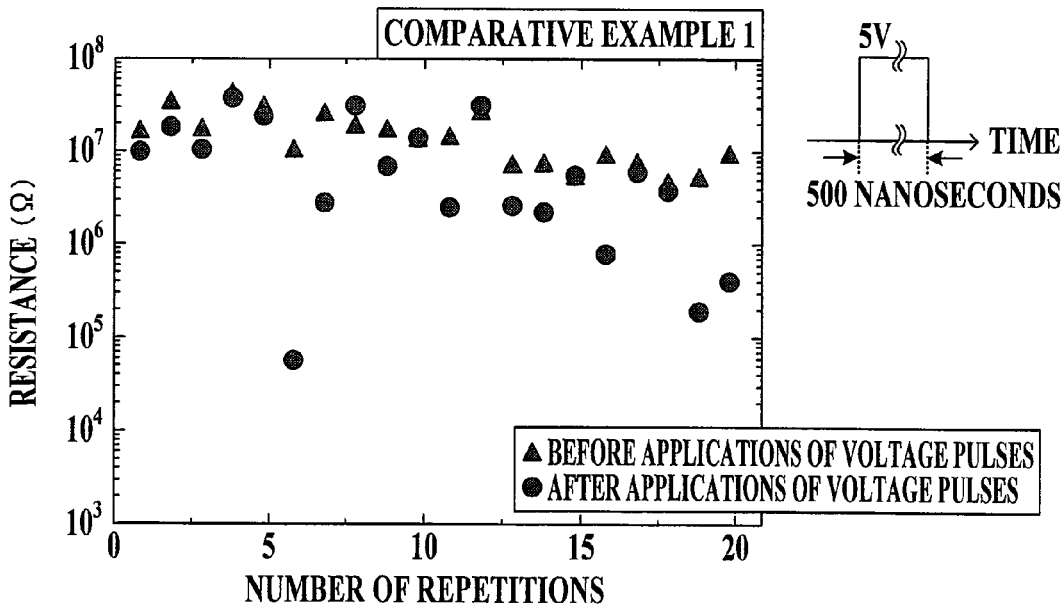
FIG. 5B is a diagram showing the results of resistance value changes at the time of performing the applications of voltage pulses repeatedly in Comparative Example 1.

The results are shown in FIG. 5B.

The abscissa axes of FIGS. 5A and 5B indicate the numbers of repetitions, and the ordinate axes of FIGS. 5A and 5B indicate resistance values between the nanogap electrodes. The triangular marks (▲) indicate the results before the applications of the voltage pulses, and the circular marks (●) indicate the results after the applications of the voltage pulses.

From the results of Comparative Example 1 (FIG. 5B), it can be known that it is difficult to distinguish between the range in which the triangular marks are distributed and the range in which the circular marks are distributed, and that it is difficult to shift the nanogap switching element 10 from its high resistance state to its low resistance state only by the application of the voltage pulse of the second voltage value even if the pulse width thereof is elongated.

On the other hand, from the results of Example 1 (FIG. 5A), it can be known that it becomes easy to distinguish between the range in which the triangular marks are distributed and the range in which the circular marks are distributed by the applications of the voltage pulse of the intermediate voltage value and the voltage pulse of the second voltage value, and that the probability of shifting the nanogap switching element 10 from its high resistance state to its low resistance state is remarkably improved in comparison with that of Comparative Example 1 (in accordance with the related art method). Furthermore, although the voltage pulses were twice applied to the nanogap switching element 10 (the voltage pulse of the intermediate voltage value was once applied thereto and the voltage pulse of the second voltage value was once applied thereto) in order to shift the nanogap switching element 10 from the high resistance state to the low resistance state, the pulse width of each of the voltage pulses were short to be ten nanoseconds, and the voltage pulse application time was twenty nanoseconds (the voltage pulse of the intermediate voltage value was applied thereto for ten nanoseconds and the voltage pulse of the second voltage value was applied thereto for ten nanoseconds). Consequently, it is known that the voltage pulse application time can be shortened in comparison with the voltage pulse application time of 500 nanoseconds of Comparative Example 1 (in accordance with the related art method).

From the above results, it is known that each of the nanogap switching elements 10 can be shifted from its high resistance state to its low resistance state at a higher speed and with a higher probability than those of the related art method by applying the voltage pulse of the intermediate voltage value and the voltage pulse of the second voltage value to the nanogap switching element 10.

According to the drive method of the nanogap switching elements 10 of the present invention and the storage apparatus 1000 equipped with the nanogap switching elements 10 mentioned above, each of the nanogap switching element 10 includes the insulation substrate 1, the first and second electrodes 2 and 3 formed on the insulation substrate 1, and the inter-electrode gap portion 4 formed between the first and second electrodes 2 and 3 and including the gap of the nanometer order between them for causing a switching phenomenon of a resistance of the inter-electrode gap portion 4 by receiving the application of a predetermined voltage between the first and second electrodes 2 and 3, and each of the nanogap switching elements 10 receives the application of the voltage pulse of the first voltage value in order to be shifted from its predetermined low resistance state to its predetermined high resistance state and the application of the voltage pulse of the second voltage value lower than the first voltage value in order to be shifted from the high resistance state to the low resistance state. Furthermore, the drive method and the storage apparatus 1000 apply a voltage pulse of an intermediate voltage value between the first voltage value and the second voltage value to the nanogap switching element 10 before the application of the voltage pulse of the second voltage value at time of shifting the nanogap switching element 10 from the high resistance state to the low resistance state.

Consequently, because the application of the voltage pulse of the intermediate voltage value to the nanogap switching element 10 makes it possible to give a cue of shifting the nanogap switching element 10 from its high resistance state to its low resistance state to the nanogap switching element 10, it is possible to shift the nanogap switching element 10 from the high resistance state to the low resistance state with a higher probability than that of the related art method.

Furthermore, although the voltage pulses are twice applied to the nanogap switching element 10 by the application of the voltage pulse of the intermediate voltage value, the nanogap switching element 10 can be shifted from its high resistance state to its low resistance state even if the voltage pulse application time is shortened in comparison with the related art voltage pulse application time, and the shift of the state of the nanogap switching element 10 can be carried out at a higher speed than that of the related art method by shortening the pulse width of each of the voltage pulses sufficiently in comparison with the related art pulse width.

Moreover, according to the drive method of the nanogap switching elements 10 and the storage apparatus 1000 equipped with the nanogap switching elements 10 of the present invention, if one of the nanogap switching elements 10 is judged not to have been shifted from its high resistance state to its low resistance state by the applications of the voltage pulses of the intermediate voltage value and the second voltage value, then the voltage pulses of the intermediate voltage value are applied to the nanogap switching element 10 by a plurality of times so that the number of applications of the voltage pulses may be larger than that at the last time, following which the voltage pulse of the second voltage value is applied to the nanogap switching element 10.

Consequently, because the cue of shifting the nanogap switching element 10 from the high resistance state to the low resistance state can be given to the nanogap switching element 10 more by applying the voltage pulses of the intermediate voltage value thereto by the plurality of times, the nanogap switching element 10 can be shifted from the high resistance state to the low resistance state with a higher probability.

Incidentally, the present invention is not limited to the embodiment mentioned above, but can be suitably changed without departing from the spirit of the present invention.

<Modification 1>

Although the embodiment described above is configured to applying only a voltage pulse of the second voltage value to one of the nanogap switching elements 10 first at the time of shifting the nanogap switching element 10 from its high resistance state to its low resistance state, and then to apply the voltage pulses of the intermediate voltage value and the second voltage value thereto when the nanogap switching element 10 is judged not to have been shifted from the high resistance state to the low resistance state, the application of only the voltage pulse of the second voltage value thereto may be omitted.

That is, when the CPU 410 shifts one of the nanogap switching elements 10 from the high resistance state to the low resistance state, the CPU 410 executes the voltage application control program 431 to apply a voltage pulse of the intermediate voltage value to the nanogap switching element 10 first, and then to apply a voltage pulse of the second voltage value thereto.

Then, if the nanogap switching element 10 is judged not to have been shifted from the high resistance state to the low resistance state by the applications of the voltage pulses of the intermediate voltage value and the second voltage value, then the CPU 410 applies the voltage pulses of the intermediate voltage values to the nanogap switching element 10 by a plurality of times so that the number of applications of the voltage pluses of the intermediate voltage values thereto may be larger than that at the last time, and after that, the CPU 410 applies the voltage pulse of the second voltage value to the nanogap switching element 10.

Figure 6:
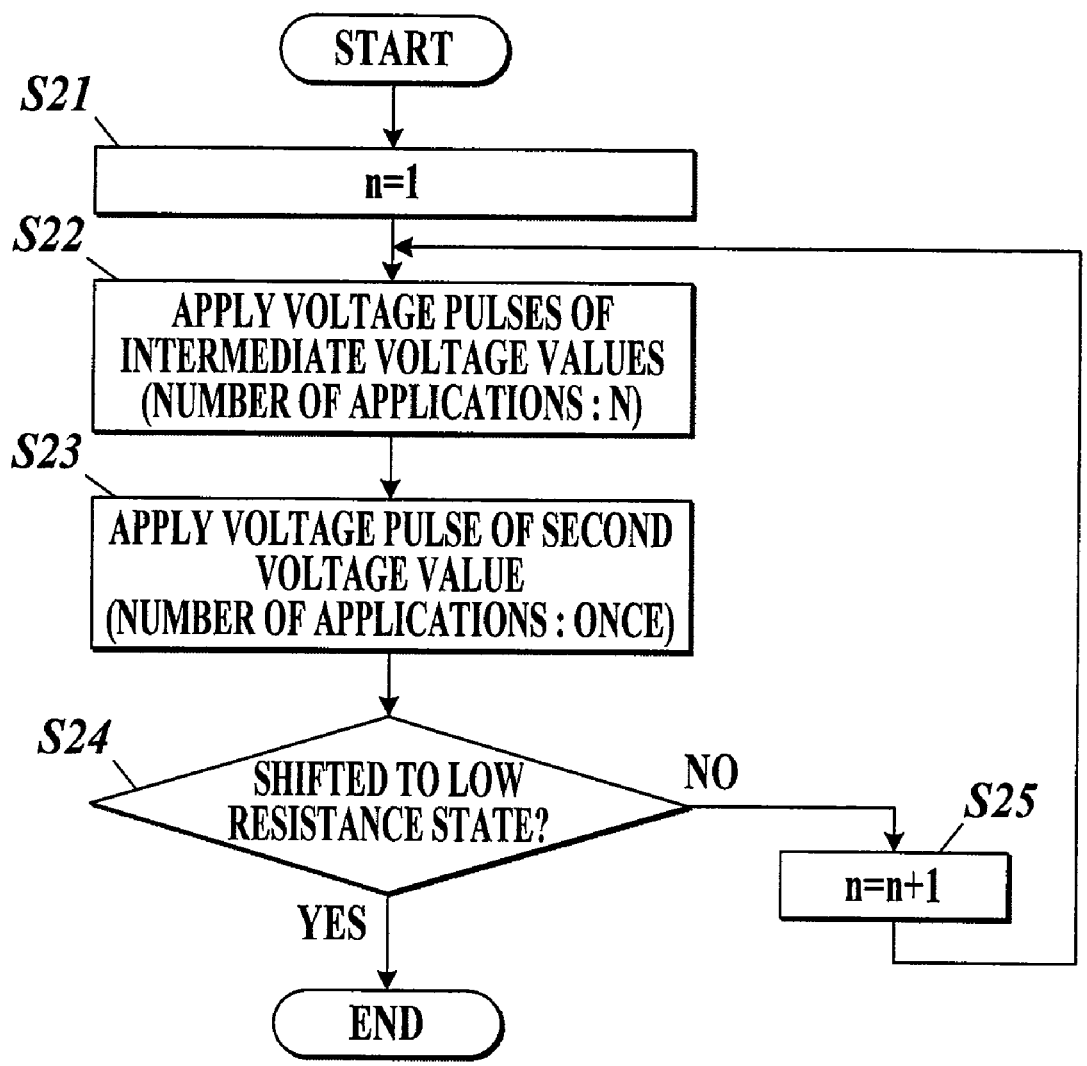
FIG. 6 is a flow chart for illustrating a modification of the drive method of a nanogap switching element of the present invention.

The processing of shifting the nanogap switching element 10 from the high resistance state to the low resistance state by the storage apparatus 1000 will be described with reference to the flow chart of FIG. 6 as the drive method of the nanogap switching element 10 in this case.

The CPU 410 first set "1" into the "n" storage region in the RAM 420 (Step S21).

The CPU 410 next executes the voltage application control program 431 to apply a voltage pulse of an intermediate voltage value to the nanogap switching element 10 n times (Step S22), and apply a voltage pulse of the second voltage value thereto once (Step S23).

The CPU 410 next executes the judgment program 432 to judge whether the nanogap switching element 10 has been shifted from its high resistance state to its low resistance state or not (Step S24).

If the CPU 410 judges that the nanogap switching element 10 has not been shifted from the high resistance state to the low resistance state at Step S24 (Step S24: No), then the CPU 410 sets a number "n+1" into the "n" storage region in the RAM 420 (Step S25), and carries out the processing on and after Step S22 repeatedly.

On the other hand, if the CPU 401 judges that the nanogap switching element 10 has been shifted from the high resistance state to the low resistance state at Step S24 (Step S24: Yes), then the CPU 410 ends the present processing.

If "1" is set in the "n" storage region in the RAM 420 here, then Steps S22 and S23 correspond to the first application steps in claim 4 or 6, and Step S24 corresponds to the judgment step in claim 4 or 6. If a "value of 2 or more" is set in the "n" storage region in the RAM 420, Steps S22 and S23 correspond to the second application step in claim 4 or 6, and Step S24 corresponds to the judgment step in claim 4 or 6.

According to Modification 1, because the cue of shifting one of the nanogap switching elements 10 from its high resistance state to its low resistance state can be given thereto earlier by applying the voltage pulse of the intermediate voltage value at an early stage, the nanogap switching element 10 can be shifted from the high resistance state to the low resistance state at a higher speed and with a higher probability.

Incidentally, the configuration and the shape of each part of each of the nanogap switching elements 10 that have been shown in the embodiment mentioned above are only examples, and those of the present invention are not limited to the shown ones.

For example, although the first and second electrodes 2 and 3 are arranged in a lateral direction as the nanogap electrodes with the gap of the nanometer order between them on the top surface of the insulation substrate 1, the arrangement of the first and second electrodes 2 and 3 is not limited to this arrangement, and for example, the first and second electrodes 2 and 3 may be arranged in a longitudinal direction. The integration degree of the storage apparatus 1000 can be thereby improved.

Moreover, for example, apart (for example, the nanogap switching element array 100) or the whole of the storage apparatus 1000 may be sealed with a predetermined sealing material to prevent the contact of the inter-electrode gap portions 4 with the air and water. The nanogap switching elements 10 can be operated more stably thereby. Furthermore, the inter-electrode gap portions 4 can be held in the state of being arranged in an arbitrary atmosphere by being sealed with the predetermined sealing material, and the nanogap switching elements 10 can be used in an arbitrary atmosphere.

Not only judging whether one of the nanogap switching elements 10 has been shifted from its high resistance state to its low resistance state or not is carried out, but also judging whether the nanogap switching element 10 has been shifted from the low resistance state to a highly stable state or not may be carried out. Then, if the nanogap switching element 10 is judged not to have been shifted from the low resistance state to the high resistance state, then the voltage pulses of the first voltage value may be applied to the nanogap switching element 10 by a plurality of times.

In this case, the number of applications of the voltage pulse of the first voltage value is set to be increased one by one every judgment of the non-shifting of the state of the nanogap switching element 10 from the low resistance state to the high resistance state. If the number of applications of the voltage pulse of the first voltage value is plural, then the first voltage value is set to be gradually increased to be higher and then to be applied to the nanogap switching element 10.

That is, if the number of applications of the voltage pulse of the first voltage value is two, then for example, a voltage pulse of the first voltage value higher than the second voltage value (the voltage pulse of the first voltage value at the first time) is applied to the nanogap switching element 10, and after that, a voltage pulse of the first voltage value higher than the voltage value of the voltage pulse of the first voltage value at the first time (the voltage pulse of the first voltage value at the second time) is applied to the nanogap switching element 10. Then it is carried out to rejudge whether the nanogap switching element 10 has been shifted from the low resistance state to the high resistance state or not. If the number of applications of the voltage pulse of the first voltage value is three, then for example, a voltage pulse of the first voltage value higher than the second voltage value (the voltage pulse of the first voltage value at the first time) is applied to the nanogap switching element 10, and after that, a voltage pulse of the first voltage value higher than the voltage value of the voltage pulse of the first voltage value at the first time (the voltage pulse of the first voltage value at the second time) is applied to the nanogap switching element 10, following which a voltage pulse of the first voltage value higher than the voltage value of the voltage pulse of the first voltage value at the second time (the voltage pulse of the first voltage value at the third time) is applied to the nanogap switching element 10. Then it is carried out to rejudge whether the nanogap switching element 10 has been shifted from the low resistance state to the high resistance state or not.

Incidentally, if the number of applications of the voltage pulses of the first voltage values is plural, then the first voltage values are arbitrary as long as the first voltage values are higher than the second voltage value and the first voltage values gradually become higher. That is, if the number of applications of the voltage pulses of the first voltage values is two, then the voltage value of the voltage pulse of the first voltage value at the first time is arbitrary as long as the voltage value is higher than the second voltage value, and the voltage value of the voltage pulse of the first voltage value at the second time is arbitrary as long as the voltage value is higher than that of the voltage pulse of the first voltage value at the first time.

Moreover, the voltage pulse of the first voltage value may be once applied to one of the nanogap switching elements 10 by gradually heightening the first voltage value every judgment of the non-shifting of the nanogap switching element 10 from its low resistance state to its high resistance state.

To put it concretely, for example, if a voltage pulse of the first voltage value (for example, a voltage pulse of ten volts) is once applied to the nanogap switching element 10 and it is carried out to judge whether the nanogap switching element 10 has been shifted from the low resistance state to the high resistance state or not, and if the nanogap switching element 10 is judged not to have been shifted from the low resistance state to the high resistance state as the result of the judgment, then a voltage pulse of the first voltage value higher than the voltage value (ten volts) of the voltage pulse of the first voltage value at the last time (for example, the voltage pulse of twelve volts) is once applied to the nanogap switching element 10, and it is carried out to rejudge whether the nanogap switching element 10 has been shifted from the low resistance state to the high resistance state or not. Such an operation may be carried out repeatedly until the nanogap switching element 10 is judged to have been shifted from the low resistance state to the high resistance state.

The first voltage value and the second voltage value are not limited to those of the embodiment described above, but are arbitrary as long as the second voltage value is lower than the first voltage value. Moreover, the intermediate voltage values are not limited to those of the embodiment described above, but are arbitrary as long as they are the values between the first voltage value and the second voltage value.

Moreover, the numbers of applications of the first voltage value and the second voltage value are not limited to those of the embodiment described above, but they are arbitrary. Moreover, the numbers of applications of the intermediate voltage values are not limited to those of the embodiment described above, but they are arbitrary as long as the number of applications increases every time of the judgment of the non-shifting of one of the nanogap switching elements 10 from its high resistance state to its low resistance state.

The entire disclosure of Japanese Patent Application No. 2007-328393 filed on Dec. 20, 2007 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A drive method of a nanogap switching element, the nanogap switching element including an insulation substrate, first and second electrodes formed on the insulation substrate, and an inter-electrode gap portion formed between the first and second electrodes and including a gap of a nanometer order between them for causing a switching phenomenon of a resistance of the inter-electrode gap portion by applying a predetermined voltage between the first and second electrodes thereto, wherein a voltage pulse of a first voltage value is applied to the nanogap switching element in order to be shifted from a predetermined low resistance state to a predetermined high resistance state and a voltage pulse of a second voltage value lower than the first voltage value is applied to the nanogap switching element in order to be shifted from the high resistance state to the low resistance state, the method comprising the step of:

applying a voltage pulse of an intermediate voltage value between the first voltage value and the second voltage value to the nanogap switching element before applying the voltage pulse of the second voltage value thereto at the time of shifting the nanogap switching element from the high resistance state to the low resistance state.

2. The drive method of a nanogap switching element according to claim 1, further comprising steps executed at the time of shifting the nanogap switching element from the high resistance state to the low resistance state, wherein the steps include:

a first application step of applying the voltage pulse of the second voltage value to the nanogap switching element without applying the voltage pulse of the intermediate voltage value;

a judgment step of judging whether the nanogap switching element has been shifted from the high resistance state to the low resistance state or not by applying the voltage pulse of the second voltage value thereto; and a second application step of applying the voltage pulse of the intermediate voltage value to the nanogap switching element, and then applying the voltage pulse of the second voltage value thereto after applying the voltage pulse of the intermediate voltage value thereto if the nanogap switching element is judged not to have been shifted from the high resistance state to the low resistance state at the judgment step.

3. The drive method of a nanogap switching element according to claim 2, further comprising:
a second judgment step of judging whether the nanogap switching element has been shifted from the high resistance state to the low resistance state or not by applying the voltage pulses of the intermediate voltage value and the second voltage value to the nanogap switching element;
a third application step of applying the voltage pulse of the intermediate voltage value to the nanogap switching element by a plurality of times so that the number of applications of the voltage pulses of the intermediate voltage value thereto may be larger than the number of applications at the last time, and then applying the voltage pulse of the second voltage value thereto after applying the voltage pulses of the intermediate voltage value thereto if the nanogap switching element is judged not to have been shifted from the high resistance state to the low resistance state at the second judgment step; and
a step of carrying out the second judgment step and the third application step repeatedly until the nanogap switching element is judged to have been shifted from the high resistance state to the low resistance state at the second judgment step.

4. The drive method of a nanogap switching element according to claim 1, further comprising steps executed at the time of shifting the nanogap switching element from the high resistance state to the low resistance state, wherein the steps include:
a first application step of applying the voltage pulse of the intermediate voltage value to the nanogap switching element, and then applying the voltage pulse of the second voltage value thereto after applying the voltage pulse of the intermediate voltage value thereto;
a judgment step of judging whether the nanogap switching element has been shifted from the high resistance state to the low resistance state or not by applying the voltage pulses of the intermediate voltage value and the second voltage value thereto;
a second application step of applying the voltage pulse of the intermediate voltage value to the nanogap switching element by a plurality of times so that the number of applications of the voltage pulses of the intermediate voltage value thereto may be larger than the number of applications at the last time, and then applying the voltage pulse of the second voltage value thereto after applying the voltage pulses of the intermediate voltage value thereto if the nanogap switching element is judged not to have been shifted from the high resistance state to the low resistance state at the second judgment step; and
a step of carrying out the judgment step and the second application step repeatedly until the nanogap switching element is judged to have been shifted from the high resistance state to the low resistance state at the judgment step.

5. A drive method of a nanogap switching element, the nanogap switching element including an insulation substrate, first and second electrodes formed on the insulation substrate, and an inter-electrode gap portion formed between the first and second electrodes to include a gap of a nanometer order between them for causing a switching phenomenon of a resistance of the inter-electrode gap portion by applying a predetermined voltage between the first and second electrodes thereto,
wherein a voltage pulse of a first voltage value is applied to the nanogap switching element in order to be shifted from a predetermined low resistance state to a predetermined high resistance state and a voltage pulse of a second voltage value lower than the first voltage value is applied to the nanogap switching element in order to be shifted from the high resistance state to the low resistance state, the method comprising steps executed at the time of shifting the nanogap switching element from the high resistance state to the low resistance state, wherein the steps include:
a first application step of applying the voltage pulse of the second voltage value once to the nanogap switching element;
a first judgment step of judging whether the nanogap switching element has been shifted from the high resistance state to the low resistance state or not by applying the voltage pulse of the second voltage value thereto;
a second application step of applying a voltage pulse of an intermediate voltage value between the first voltage value and the second voltage value once to the nanogap switching element, and then applying the voltage pulse of the second voltage value once to the nanogap switching element after applying the voltage pulse of the intermediate voltage value thereto if the nanogap switching element is judged not to have been shifted from the high resistance state to the low resistance state at the first judgment step;
a second judgment step of judging whether the nanogap switching element has been shifted from the high resistance state to the low resistance state or not by applying the voltage pulses of the intermediate voltage value and the second voltage value thereto;
a third application step of applying the voltage pulses of the intermediate voltage values to the nanogap switching element by a plurality of times so that the number of applications of the voltage pulses of the intermediate voltage value thereto may be larger than the number of applications at the last time, and then applying the voltage pulse of the second voltage value once to the nanogap switching element after applying the voltage pulses of the intermediate voltage value thereto if the nanogap switching element is judged not to have been shifted from the high resistance state to the low resistance state at the second judgment step; and
a step of carrying out the second judgment step and the third application step repeatedly until the nanogap switching element is judged to have been shifted from the high resistance state to the low resistance state at the second judgment step.

6. A drive method of a nanogap switching element, the nanogap switching element including an insulation substrate, first and second electrodes formed on the insulation substrate, and an inter-electrode gap portion formed between the first and second electrodes to include a gap of a nanometer order between them for causing a switching phenomenon of a resistance of the inter-electrode gap portion by applying a predetermined voltage between the first and second electrodes thereto,
wherein a voltage pulse of a first voltage value is applied to the nanogap switching element in order to be shifted from a predetermined low resistance state to a predetermined high resistance state and a voltage pulse of a second voltage value lower than the first voltage value is applied to the nanogap switching element in order to be shifted from the high resistance state to the low resistance state, the method comprising steps at the time of shifting the nanogap switching element from the high resistance state to the low resistance state, wherein the steps include:

a first application step of applying a voltage pulse of an intermediate voltage value between the first voltage value and the second voltage value to the nanogap switching element once, and then applying the voltage pulse of the second voltage value thereto once after applying the voltage pulse of the intermediate voltage value thereto;

a judgment step of judging whether the nanogap switching element has been shifted from the high resistance state to the low resistance state or not by applying the voltage pulses of the intermediate voltage value and the second voltage value thereto;

a second application step of applying the voltage pulses of the intermediate voltage values to the nanogap switching element by a plurality of times so that the number of applications of the voltage pulses of the intermediate voltage value thereto may be larger than the number of applications at the last time, and then applying the voltage pulse of the second voltage value once to the nanogap switching element after applying the voltage pulses of the intermediate voltage value thereto if the nanogap switching element is judged not to have been shifted from the high resistance state to the low resistance state at the judgment step; and a step of carrying out the judgment step and the second application step repeatedly until the nanogap switching element is judged to have been shifted from the high resistance state to the low resistance state at the judgment step.

7. A storage apparatus comprising a nanogap switching element, the nanogap switching element being shifted from its high resistance state to its low resistance state by the drive method according to claim 1.

8. A storage apparatus comprising a nanogap switching element, the nanogap switching element being shifted from its high resistance state to its low resistance state by the drive method according to claim 2.

9. A storage apparatus comprising a nanogap switching element, the nanogap switching element being shifted from its high resistance state to its low resistance state by the drive method according to claim 3.

10. A storage apparatus comprising a nanogap switching element, the nanogap switching element being shifted from its high resistance state to its low resistance state by the drive method according to claim 4.

11. A storage apparatus comprising a nanogap switching element, the nanogap switching element being shifted from its high resistance state to its low resistance state by the drive method according to claim 5.

12. A storage apparatus comprising a nanogap switching element, the nanogap switching element being shifted from its high resistance state to its low resistance state by the drive method according to claim 6.

\* \* \* \* \*

UNITED STATES PATENT AND TRADEMARK OFFICE
CERTIFICATE OF CORRECTION

| | | |
|---|---|---|
| PATENT NO. | : 7,990,751 B2 | Page 1 of 1 |
| APPLICATION NO. | : 12/338313 | |
| DATED | : August 2, 2011 | |
| INVENTOR(S) | : Yuichiro Masuda et al. | |

It is certified that error appears in the above-identified patent and that said Letters Patent is hereby corrected as shown below:

In Column 13, line 54, please change "pluses" to --pulses--.

In Column 14, line 13, please change "401" to --410--.

Signed and Sealed this
Twenty-second Day of November, 2011

David J. Kappos
*Director of the United States Patent and Trademark Office*